United States Patent
Yang

(10) Patent No.: US 10,651,372 B2
(45) Date of Patent: May 12, 2020

(54) PROCESS FOR PATTERNING A MAGNETIC TUNNEL JUNCTION

(71) Applicant: Tokyo Electron Limited, Minato-ku, Tokyo (JP)

(72) Inventor: Qingyun Yang, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/004,932

(22) Filed: Jun. 11, 2018

(65) Prior Publication Data

US 2018/0358548 A1 Dec. 13, 2018

Related U.S. Application Data

(60) Provisional application No. 62/518,851, filed on Jun. 13, 2017.

(51) Int. Cl.
| | | |
|---|---|---|
| H01L 21/66 | (2006.01) | |
| H01L 43/12 | (2006.01) | |
| H01L 43/10 | (2006.01) | |
| H01L 43/08 | (2006.01) | |
| H01L 27/22 | (2006.01) | |

(52) U.S. Cl.
CPC ............. *H01L 43/12* (2013.01); *H01L 22/26* (2013.01); *H01L 27/222* (2013.01); *H01L 43/08* (2013.01); *H01L 43/10* (2013.01); *H01L 22/12* (2013.01); *H01L 22/20* (2013.01)

(58) Field of Classification Search
CPC ......... H01L 43/12; H01L 22/26; H01L 43/08; H01L 43/10; H01L 22/12; H01L 22/20; H01L 43/02; H01L 29/82; H01L 27/222–228; G11C 11/14–1697; G11C 11/5607; G11C 14/0036
See application file for complete search history.

(56) References Cited

U.S. PATENT DOCUMENTS

| | | | | |
|---|---|---|---|---|
| 6,024,885 | A * | 2/2000 | Pendharkar | B82Y 10/00 216/22 |
| 2004/0043620 | A1* | 3/2004 | Ying | B82Y 25/00 438/710 |
| 2014/0287591 | A1* | 9/2014 | Nishimura | H01L 43/12 438/714 |
| 2016/0035855 | A1* | 2/2016 | Marks | H01L 29/4908 257/40 |
| 2016/0308112 | A1* | 10/2016 | Tan | H01L 41/47 |
| 2017/0194561 | A1* | 7/2017 | Suyama | H01L 43/10 |

* cited by examiner

*Primary Examiner* — Shahed Ahmed
(74) *Attorney, Agent, or Firm* — Oblon, McClelland, Maier & Neustadt, L.L.P.

(57) ABSTRACT

A process and device is disclosed for etching a magnetroresistive random access memory device which includes at least one magnetic tunnel junction stack structure which includes an insulating layer disposed between first and second magnetic layers. The process includes the step of contacting a substrate with a chlorine containing plasma at a temperature no greater than 30 degrees Centigrade under conditions effective to convert at least a portion of the first and second magnetic layers and the insulating layer into metal chlorides. Next, the resulting product of the contacting step is treated with an organic solvent under conditions effective to remove the metal chlorides. The treatment can include rinsing away the metal chlorides either by dissolving the metal chlorides, or by reacting the metal chlorides with a reactive organic solvent, or both.

19 Claims, 5 Drawing Sheets

PROCESS FOR PATTERNING A MAGNETIC TUNNEL JUNCTION

CROSS-REFERENCE TO RELATED APPLICATIONS

This application is related to and claims priority to U.S. Provisional Patent Application Ser. No. 62/518,851, filed on Jun. 13, 2017, the entire contents of which are herein incorporated by reference.

TECHNICAL FIELD OF THE INVENTION

This invention relates to plasma etching of magnetic tunnel junctions on semiconductor substrates at low temperatures.

BACKGROUND

The performance of magnetoresistive random access memory (MRAM) continues to improve. One type of MRAM uses magnetic tunnel junction ("MTJ") stacks which contain CoFeB/MgO/CoFeB as part of the film stack. MTJ patterning which contains a stack of mostly metal films has been limited to physical sputtering, which is limited in its ability to achieve vertical profiles. As a result, sputtering does not provide adequate results in tight pitch applications. Plasma chemistry using a chlorine containing gas typically requires high temperature because of the relatively low volatility of the metal halides. In these high temperature plasma techniques, lateral diffusion of chlorine atoms can lead to undue reaction with the metal or metal oxide in the device, which leads to degradation or destruction of the MTJ and the device. New and improved methods of creating magnetic tunnel junctions are highly desirable.

SUMMARY OF THE INVENTION

The present invention provides a solution to one or more of the disadvantages and omissions described above.

In one broad respect, this invention is a process for etching a substrate which includes an insulating layer disposed between first and second magnetic layers, comprising: contacting the substrate with a chlorine containing plasma at a temperature no greater than 30 degrees Centigrade under conditions effective to convert at least a portion of the first and second magnetic layers and the insulating layer into metal chlorides. Next, the resulting substrate of the contacting step (the contacting of the substrate with the chlorine) is treated with an organic solvent under conditions effective to remove the metal chlorides. The treatment can include rinsing away the metal chlorides either by dissolving the metal chlorides, or by reacting the metal chlorides with a reactive organic solvent, or both. In an embodiment, the first and second magnetic layers contain cobalt and iron. In an embodiment, the insulating layer is a metal oxide such as magnesium oxide.

The process of this invention includes a step where the chlorine containing plasma is formed from a chlorine containing gas, wherein the chlorine containing gas is chlorine, boron trichloride, or a mixture thereof. In an embodiment, the chlorine containing gas is diluted with a second inert gas.

In an embodiment of the invention, the organic solvent is an alcohol, an ether, or acetone. In general, the organic solvent includes a solvent capable of reacting with the metal halides.

In an embodiment, the substrate being processed is layered and patterned to create a magnetoresistive random access memory device which includes at least one magnetic tunnel junction stack structure, wherein the stack structure includes an insulating layer of magnesium oxide. In an embodiment, the first and second magnetic layers of the stack structure both contain cobalt and iron.

In an embodiment, the chlorine containing gas is removed from the substrate prior to treating the substrate with the organic solvent.

In an embodiment, a first etched substrate is subjected to measurements to determine whether the extent of metal removed by the chlorine plasma and organic solvent treatment corresponds to pre-defined operational objectives. For example, the measurement includes generating a vertical profile of the etched substrate, comparing the vertical profile to a target vertical profile, and adjusting operating variables to process the substrate to form an MRAM structure having a tolerance between a vertical profile and a target vertical profile.

In an embodiment, at least one operational variable of the process is adjusted based on the measurements to meet at least one operational objective. For example, the at least one operational variable is temperature, pressure, chlorine concentration, chlorine flow rate, type of organic solvent, flow rate of the organic solvent, time of contact of the chlorine with the substrate, or a combination thereof. In one respect, the operational objective is the vertical conformity of the etched substrate to the desired pattern. For example, the vertical conformity of the substrate includes processing the substrate with the chlorine plasma until a density of 20 nm or less of space and line or space and pillar is achieved. Thus, in one respect, the operational objective can be the extent of lateral etching of the substrate.

In an embodiment, at least one operational variable is adjusted to either reduce or increase the extent of etching of the substrate, preferably to achieve a desired target objective such as the extent of etching, or the vertical conformity of the etched substrate to a desired target verticality.

After adjusting at least one operational variable, the process can be advanced by further contacting the etched substrate with a chlorine containing plasma at a temperature no greater than 30 degrees Centigrade under conditions effective to convert at least a portion of the first and second magnetic layers and the insulating layer into metal chlorides; treating the resulting substrate of the contacting step with an organic solvent under conditions effective to remove the metal chlorides from the resulting structure to provide an etched substrate. Alternatively, the first substrate or later substrates can be discarded if the substrates do not meet the operational objectives and a new substrate can be introduced into the process. In this regard, the process can further include contacting a second substrate under second operational variables with a chlorine containing plasma at a temperature no greater than 30 degrees Centigrade under conditions effective to convert at least a portion of the first and second magnetic layers and the insulating layer into metal chlorides; treating the resulting second substrate of the contacting step with an organic solvent under conditions effective to remove the metal chlorides to provide an etched second substrate.

In an embodiment, the at least one operational variable is adjusted after the etched substrate has been formed or wherein the at least one operational variable is adjusted while the substrate is being treated.

In an embodiment, the substrate is a semiconductor wafer being processed to form a magnetoresistive random access memory device which includes at least one magnetic tunnel junction stack structure.

In another broad respect, this invention is an apparatus for etching a structure which includes an insulating layer disposed between first and second magnetic layers. The device includes at least one plasma chamber configured to hold at least one substrate that includes the structure, said chamber configured to contain a plasma of a chlorine containing gas. The device also includes inlet ports for introducing the chlorine containing gas into the chamber. The chamber may be configured to include other inlets and outlet ports to permit introduction of additional materials into the chamber and for purging the chamber of the chlorine containing gas. In certain embodiments, after contact with the plasma, the chamber is purged and the substrate is transferred to a different chamber for treatment with the organic solvent. One or more solvents can be used. The second chamber can include appropriate inlet and outlets. After the metal halides have been rinsed from the substrate, the substrate can be transferred back to the first chamber for additional etching, or can be removed from the device.

In another example embodiment, a plasma processing apparatus can etch a multilayered material having a stacked structure in which a first magnetic layer, an insulating layer, a second magnetic layer, and a mask material are stacked in sequence. The plasma processing apparatus includes a processing chamber configured to partition a processing space where plasma is generated; a gas supply unit configured to supply a processing gas into the processing space; and a control unit configured to control the gas supply unit. The gas can be a chlorine containing gas which reacts with the metals in the first and second magnetic layers and the insulating layer(s).

The present invention provides an improvement over metal sputtering of metal magnetic layers in a MTJ. In addition, the lower plasma temperatures afford less power, physical device requirements, as well as limited diffusion of chlorine with the metal or metal oxide layers which would otherwise lead to degradation or destruction of the MTJ and the semiconductor device. The present invention permits the development of patterning that can produce vertical pillar profiles and enable tight pitch applications.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Figure 1A:
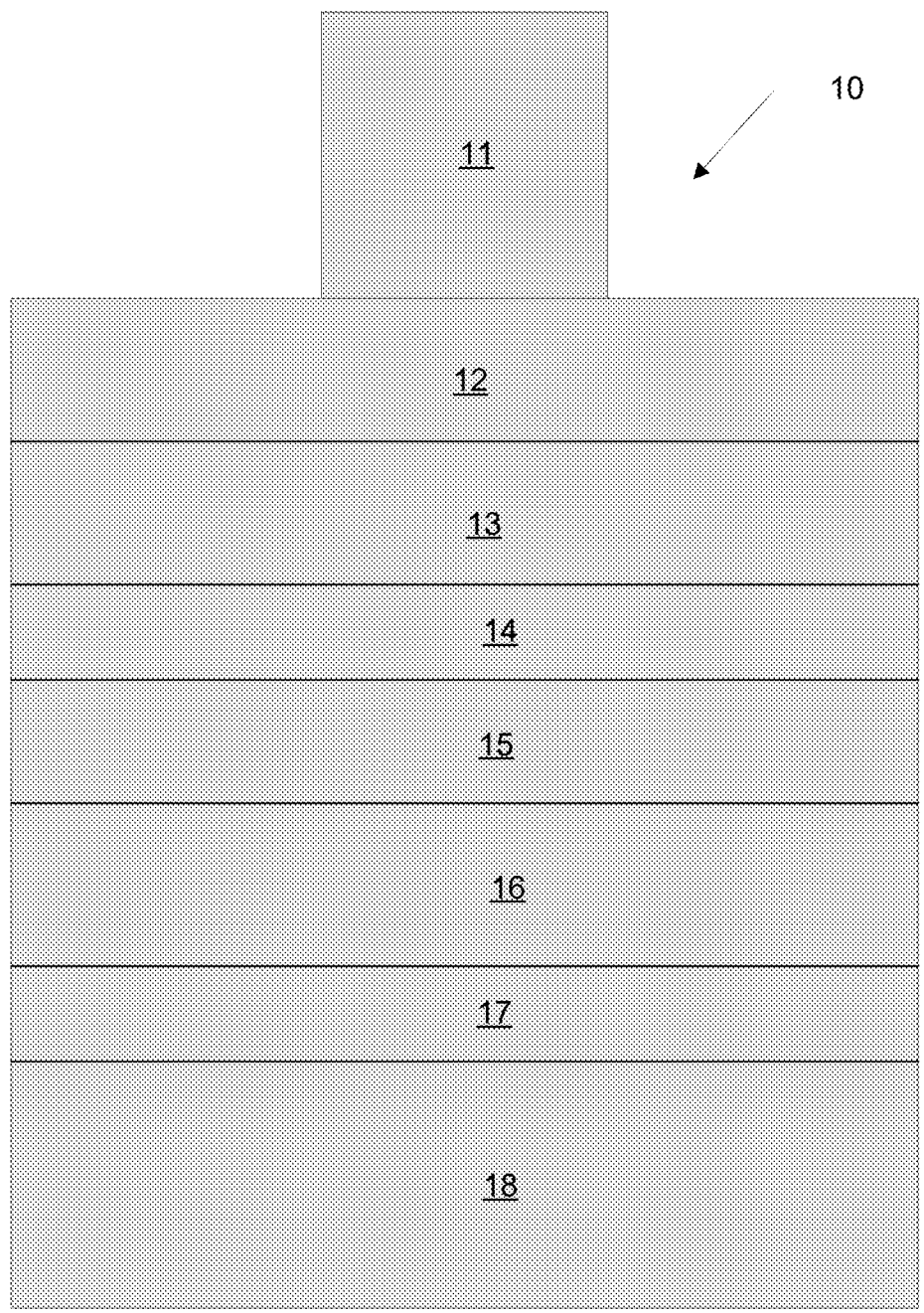
FIGS. 1A-1C illustrate a substrate having a pillar as it is processed in accordance with one embodiment of the process of this invention as well as structures used and made in the process of this invention.
Figure 1B:
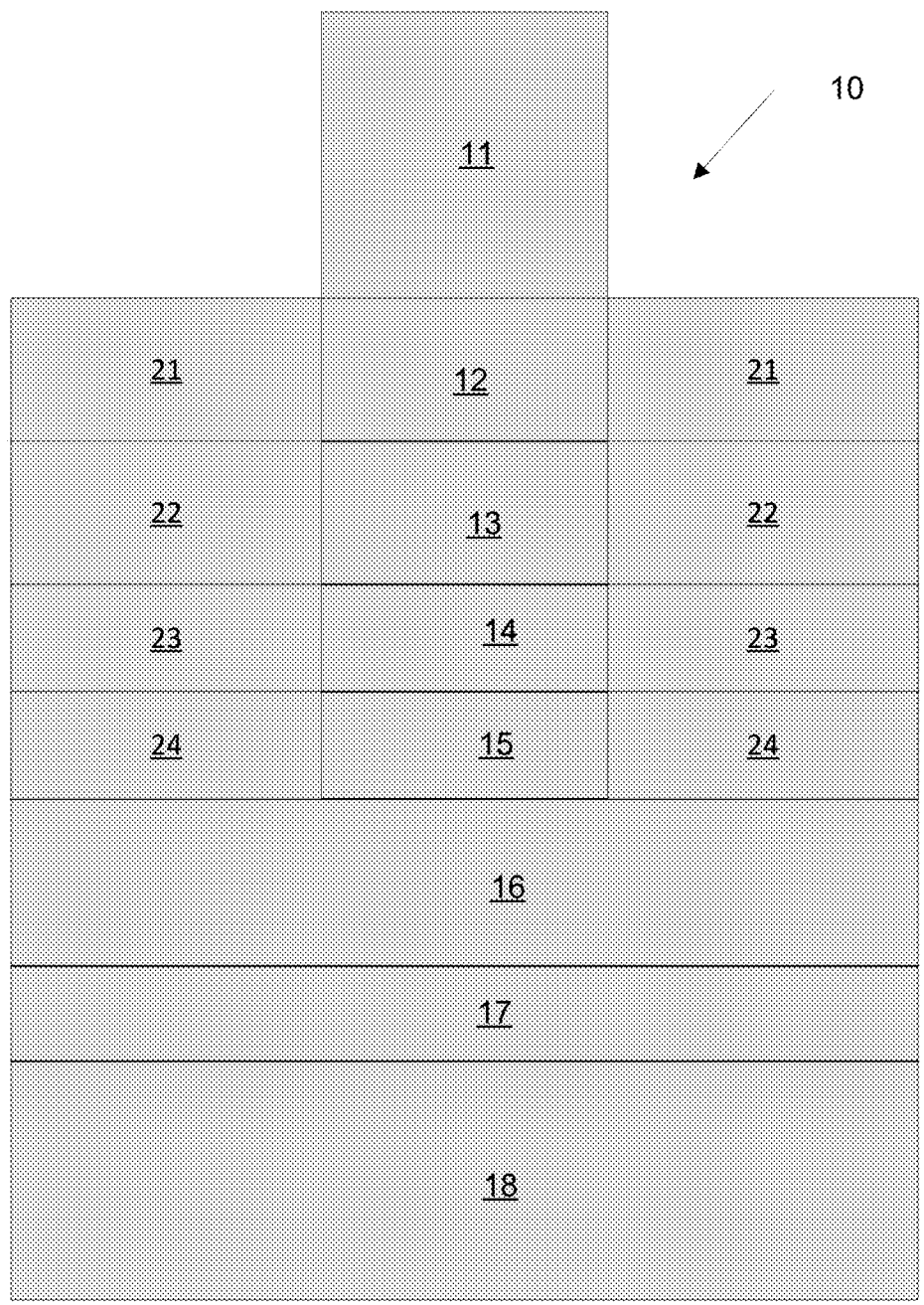
Figure 1C:
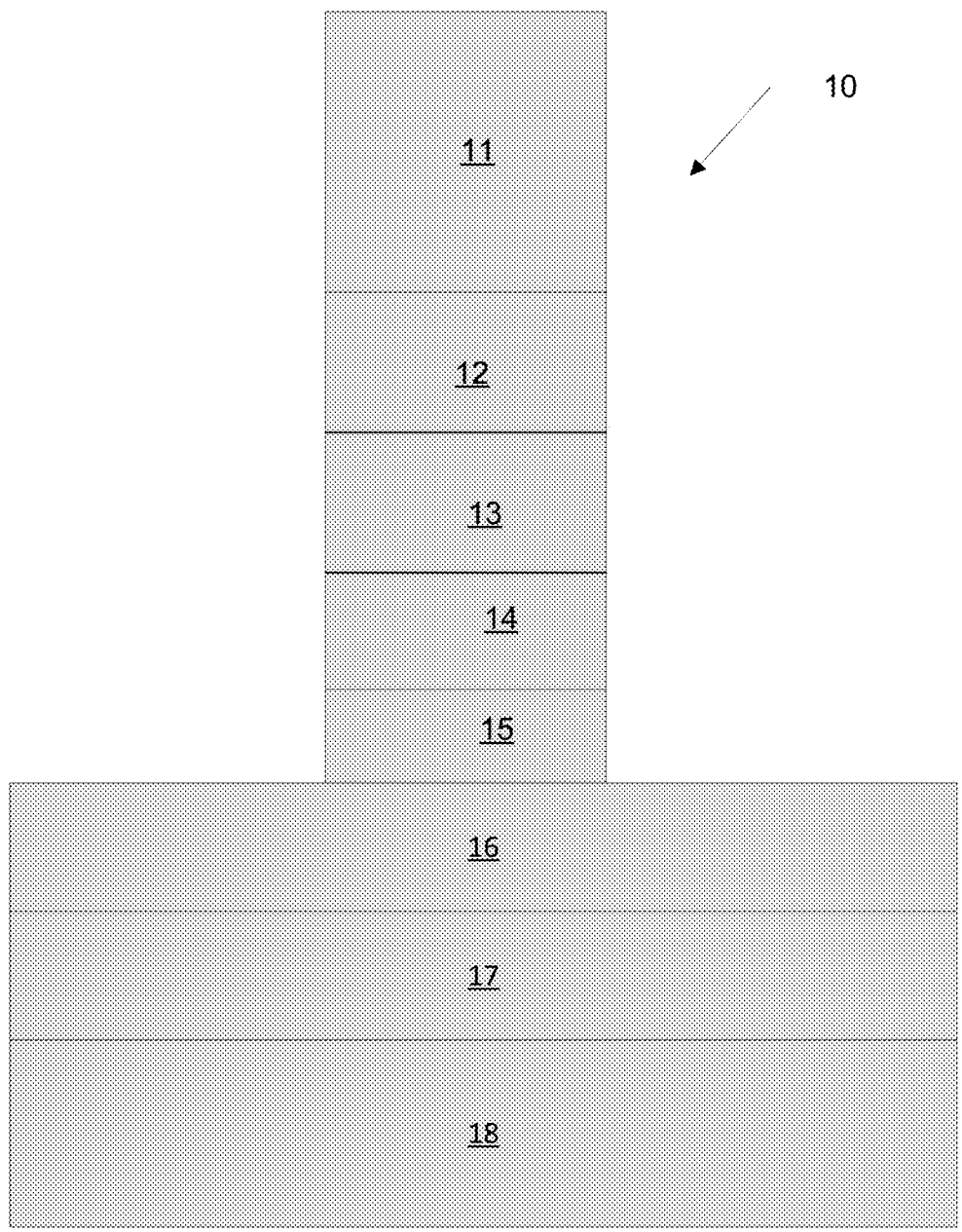

FIGS. 1A-1C generally show the progress of a substrate being treated in accordance with this invention. Substrate 10 includes an appropriate mask pattern 11 over an insulator capping or first insulating layer such as a magnesium oxide layer 12, a first magnetic metal layer 13 such as for example cobalt iron boron (CoFeB) with or without tantalum (Ta), a second insulator layer 14 such as a magnesium oxide layer, and a second magnetic metal layer 15 such as for example CoFeB. The mask pattern can be tantalum, titanium nitride, and the like of a given thickness. The second insulator layer 14 can alternatively be made of aluminum oxide, aluminum nitride, aluminum oxynitride, or other suitable materials. Typically, the second insulating layer 14 (tunneling layer) is magnesium oxide. The first and second magnetic layers 13, 15 can alternatively be formed from cobalt iron tantalum, nickel iron, cobalt, cobalt iron, cobalt platinum, cobalt palladium, iron platinum, or an alloy of nickel, cobalt and iron. These layers may be positioned over a lower substrate area, which can include 16 any conventional layer or layers, a ruthenium (Ru) spacer layer 17 or other material such as titanium, tantalum, copper, or silver, and another lower layer 18 such as cobalt platinum alloy such as (Co/Pt)xN/Co, all of which are arranged in a process of making a substrate with a MRAM device. Conventional methods are used to form all of the layers of a substrate 10 prior to the etching process of this invention. For example, a physical vapor deposition (PVD) process can be used to form some or all of the layers. Typically, each layer has a thickness of between 10 and 30 angstroms, and each layer may be of a different thickness. The first insulating layer (which can be referred to as a capping layer) can be from 3 to 20 angstrom. The substrate 10 can also be referred to herein as a structure, a wafer, a semiconductor wafer, a semiconductor substrate, a MRAM substrate, and the like.

After the low temperature chlorine plasma etch of this invention, metal halides are formed under mask pattern 11. Specifically, halides of cobalt and iron are formed. It is noted that these metal halides have given solubility in some organic solvents such as methanol and ethanol. The low temperature plasma thus forms metal halide layers 21, 22, 23, and 24 via lateral diffusion. The chlorine plasma does not react with the layers below the second magnetic layer 15.

Next the resulting substrate is subjected to a wet etch removal step using organic solvents with or without organic ligand compounds that form organometallic complexes. The organic solvents serve to dissolve the metal halides and/or the organometallic complexes, thus producing a new structure composed of layers 11, 12, 13, 14 as shown in FIG. 1C. This new structure can be referred to as a pillar. The process used in this invention can be repeated as necessary to form the structure composed of layers 11-14 in FIG. 1C. As used herein, the term pillar refers to a raised structure formed on the substrate after etching away the insulating layer and magnetic layers beneath the mask.

The chlorine containing gas in the plasma etch can be provided by chlorine gas ($Cl_2$), boron chloride ($BCl_2$), or mixtures thereof. The chlorine containing gas can be used with or without addition of other gases such as hydrogen, oxygen, carbon dioxide, ammonia, argon, and mixtures thereof. If another gas is employed, the chlorine containing gas can be in a concentration from 0.1 to 99.9 percent by volume of the total gas used. In the practice of this invention, the temperature of the plasma is 30 C or less. Typically, the temperature is from −30 C to 30 C. More typically, the temperature is from 0 C to 25 C. The pressure at which the plasma etch is conducted can be any pressure effective to achieve the desired etch. Thus, the pressure can be subatmospheric, atmospheric, and superatmospheric. The chlorine containing gas can be supplied to the substrate continuously, intermittently, or in a single charge. The time of reaction will vary depending on the gas, temperature, pressure, chlorine concentration, substrate, and other variables.

The time of contact of the chlorine with the substrate can be readily determined by routine testing under given conditions to provide a desired level of metal halide formation. Thus, a substrate can be treated initially with a given charge of the chlorine-containing gas, at a given temperature, at a given pressure, for a given amount of time.

After treatment with the chlorine plasma, the substrate can then be tested to determine the extent of lateral diffusion. For example, the extent of lateral diffusion of chlorine can be determined by wet etching the substrate to remove the metal chlorides, followed by analytical tests to determine if the metal layers have been removed laterally from the mask pattern. If the metal layers have been excessively removed in a lateral direction toward the interior of the mask pattern, the operating parameters can be adjusted to achieve less etching. While not wishing to be bound by theory, it should be appreciated that chlorine will penetrate the metal layers in a lateral direction, outward moving inward, forming metal chlorides as the chlorine moves laterally through the layers. If the extent of removal of metal layers in a lateral direction is less than desired, the operating parameters can also be adjusted to achieve greater etching. Once the operating parameters have been established, the process can be automated to etch the substrate.

If undue lateral diffusion has occurred, variables can be adjusted, such as by adjusting the temperature, contact time of the substrate with the chlorine, presence of diluent, pressure, concentration and/or flow rate of the chlorine-containing gas over the substrate, and other given variables, and a new substrate is processed with the new process conditions. The resulting first etched substrate is subjected to measurements to determine whether the extent of metal removed by the chlorine plasma and organic solvent treatment corresponds to pre-defined operational objectives. In one respect, the measurement includes generating a vertical profile of the etched substrate, comparing the vertical profile to a target vertical profile, and adjusting operating variables to process the substrate to form an MRAM structure having a tolerance between vertical profile and target vertical profile. In one respect, the vertical conformity of the substrate including processing the substrate with the chlorine plasma until a density of 20 nm or less of space and line or space and pillar is achieved.

In an embodiment, at least one operational variable of the process is adjusted based on the measurements to meet at least one operational objective. For example, the at least one operational variable is temperature, pressure, chlorine concentration, chlorine flow rate, type of organic solvent, flow rate of the organic solvent, time of contact of the chlorine with the substrate, or a combination thereof. In one respect, the operational objective is the vertical conformity of the etched substrate to the desired pattern to achieve a target tolerance.

Contact time of chlorine with substrate refers to the amount of time during which the chlorine is in physical contact with the substrate, after introduction of the chlorine into the chamber and prior to removal of the chlorine from the chamber. Contact time can be adjusted to achieve desired reaction based on, for example, the concentration of the chlorine in the chamber, type of chlorine containing reactant, flow rate, temperature, pressure, presence of diluent, or combinations thereof.

After the contacting step is complete, the chlorine containing gas is removed so that no further contact takes place. This can be achieved by for example evacuating the chamber in which the reaction occurs, by charging the chamber with a non-chlorine containing gas, and combinations thereof. It may be advantageous to use both evacuation and supplying a non-chlorine containing gas to the chamber to ensure the chamber is clear of chlorine before further manipulation of the substrate is undertaken, such as transfer to a different chamber for wet etching.

After the chlorine gas is separated from the substrate, the substrate is subjected to a wet etch step using a suitable organic solvent such as an alcohol such as methanol, ethanol, and isopropyl alcohol, an ether, acetone, or other common organic solvents. The solvent dissolves or otherwise removes the metal halides from the plasma etch step. It is known, for example, that iron trichloride has a solubility in methanol of 83 g/100 mL. Cobalt dichloride has a solubility of 38.5 g/100 mL in methanol. Magnesium chloride has a solubility of 7.4 g/100 mL in ethanol. The organic solvent thus flushes the metal halides from the substrate. In addition to such organic solvents, organic solvents which react with the metal halides to form a complex can also be used alone or in combination with the alcohol, ether, or acetone. For example, acetylacetone or cyclopentadinyl can be used to form organometallic complexes. Other reactive solvents can be used depending on the type of metal halides formed.

The plasma etch and the wet etch are typically performed in separate chambers, which can also be referred to as modules. The plasma and wet etch can be repeated depending on the desired amount of etching desired. It may be desirable to transfer the substrate (which can also be referred to as the wafer, as that term is generally understood in the field of semiconductors) being etched between chambers using equipment such that the substrate does not contact ambient atmosphere to prevent water moisture from contacting the substrate, which can lead to degradation of certain insulator layers such as magnesium oxide layers.

Figure 2:
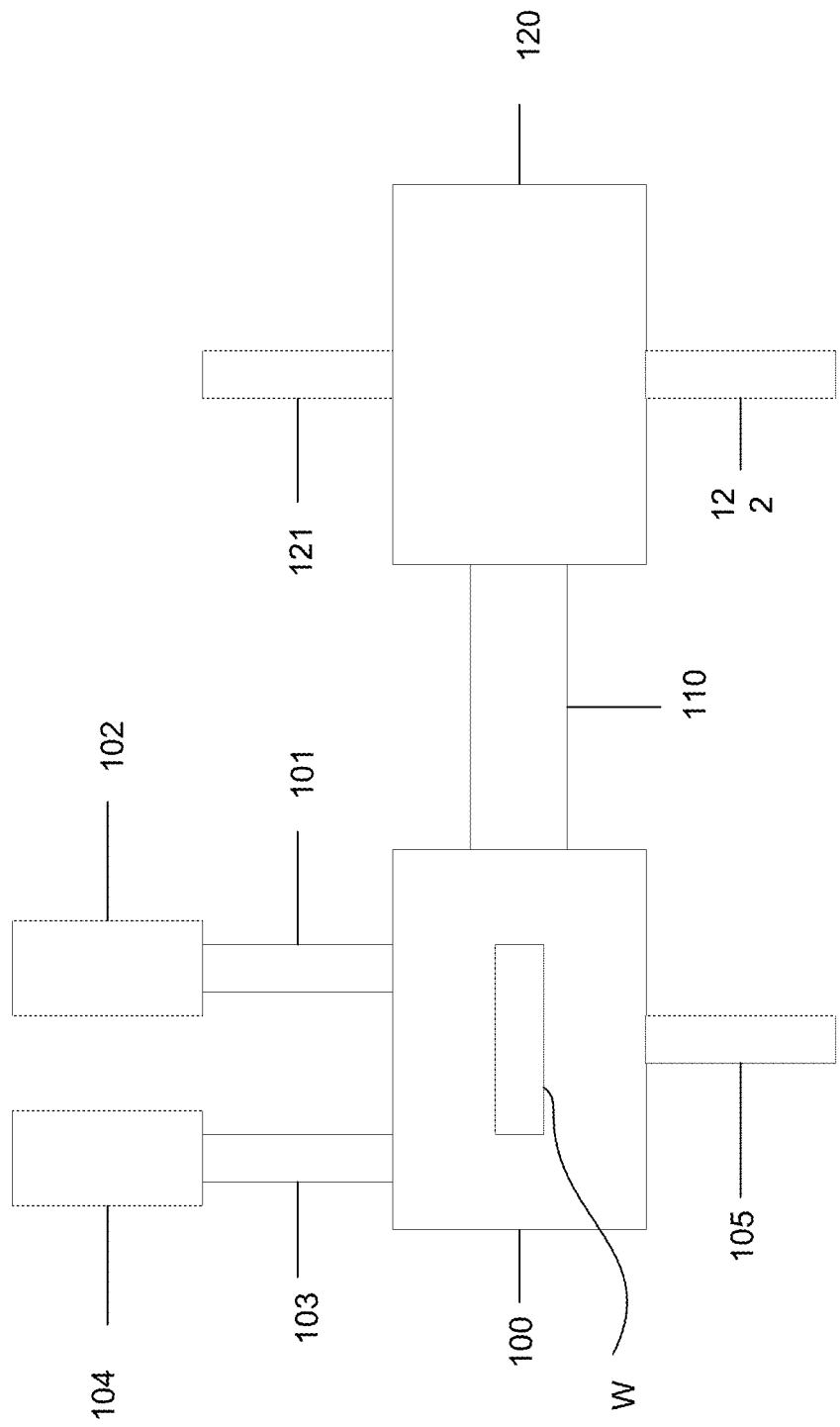
FIG. 2 illustrates an apparatus of this invention.

Referring to FIG. 2 there is shown a multi-chamber device of this invention. In FIG. 2, a substrate W is in the inner space of plasma chamber 100. The plasma chamber can be of any shape, in one embodiment being a cylinder. The plasma chamber 100 can include a circular base, which can be made of a metal such as aluminum and can serve as a first electrode for plasma generation. If needed the base can include heating or cooling lines to assist controlling the temperature of the plasma. Likewise, the plasma chamber 100 can be jacketed with heat transfer fluid in order to control temperature. The temperature within the plasma chamber 100 is continuously monitored, with the temperature information fed to a controller, not shown, which can adjust the temperature of flow of heat transfer fluid. The plasma chamber 100 is equipped with a line 101 for delivery of chlorine containing gas from gas supply 102. Multiple gases can be supplied via line 101 or, alternatively, multiple inlet lines can be included for different gases. A gas outlet line 105 can be included to purge the chamber or function as a release valve if undue pressure accumulates in the plasma chamber 100. The plasma chamber 100 can optionally be equipped with vacuum line 103 which is connected to vacuum generator 104. The vacuum generator 104 is sized to generate a vacuum down to 10 Torr, for example, if desired. When the vacuum is engaged, the gas line 101 is typically closed.

After the chlorine has been removed by, for example, repeated evacuation followed by inert gas purge, the substrate W can be transferred via transfer module 110 to wet etch chamber 120. The transfer module 110 can be, for example, a mechanical arm, robot, or any suitable mechanism for moving the substrate W. A key aspect of the transfer module 110 is that it maintains an inert atmosphere free of water moisture so that the substrate W is not contaminated, which might otherwise damage magnesium oxide layers. After transfer from plasma chamber 100 to wet etch chamber 120, the substrate W is rinsed with solvent. The solvent can be supplied via inlet line 121 to wash over the substrate W. The solvent can be flushed over the substrate W, recirculated, or otherwise intimately contacted with the lateral surface to be rinsed. The wet etch chamber 120 can include one or more shower heads to apply solvent to the substrate W. The resulting solvent which contains metal halides and/or metal halide complexes is removed from the wet etch chamber 120 via exit line 122. The wet etch chamber 120 can also be evacuated, heated, and purged with gas to remove all solvent before removal or further processing. If desired, the substrate W can be returned to plasma chamber 100 from wet etch chamber 120 via transfer module 110. These steps can be repeated until sufficient metal is removed as is desired. The wet etch chamber 120 can include a second transfer module for removing the substrate from the apparatus. Alternatively, the wet etch chamber 120 may be equipped with a door or other opening to permit manual removal of the substrate W, or to otherwise remove the substrate W from the wet etch chamber 120.

Figure 3:
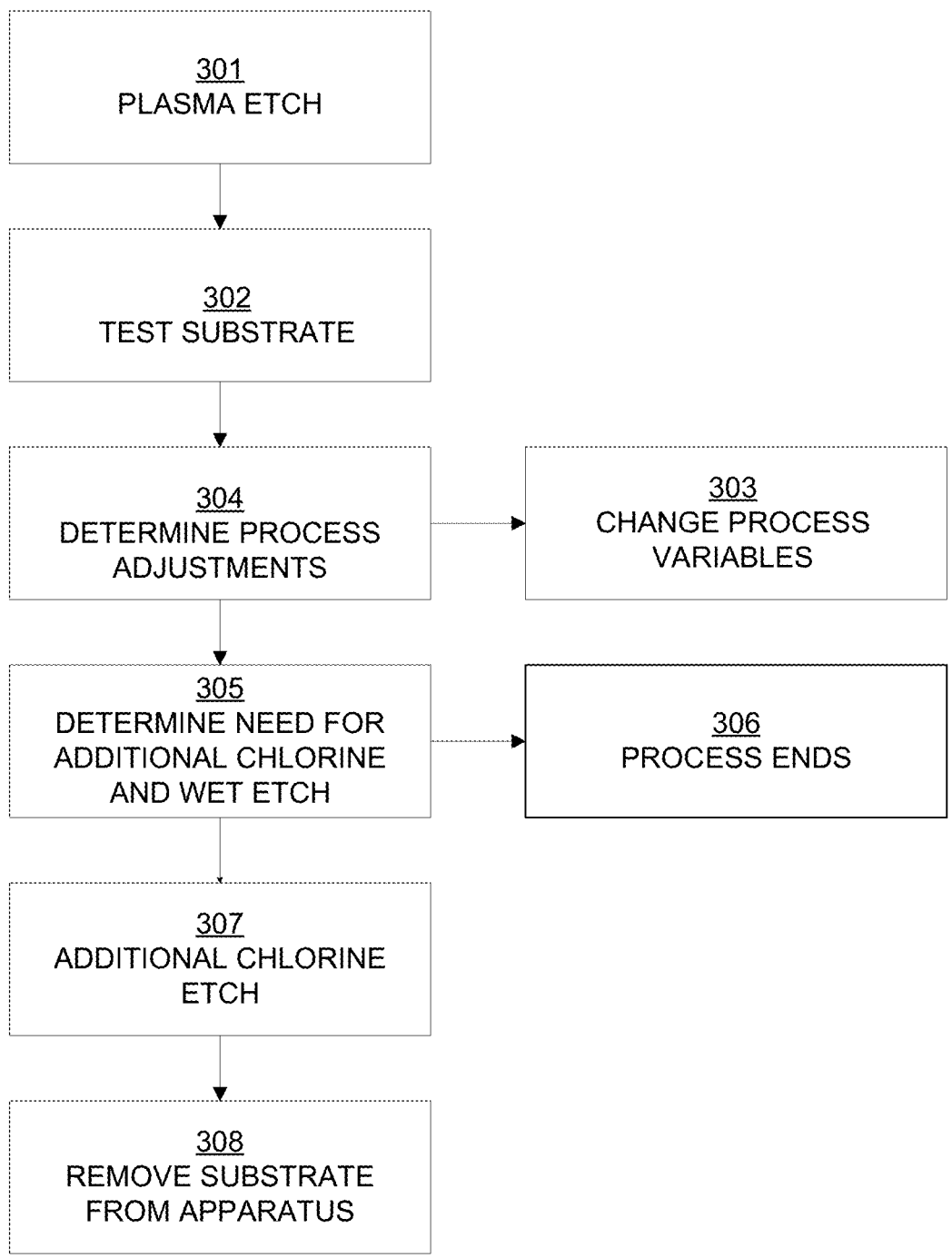
FIG. 3 illustrates a process flow scheme for treating a substrate having a metal magnetic structure in accordance with this invention.

A process flow scheme is shown in FIG. 3. In a first step 301, a substrate that includes a ferromagnetic structure to be etched (CoFe and MgO layers, for example) is contacted with a chlorine-containing room temperature or less plasma for a given contact time, temperature, pressure, flow rate, concentration, diluent amount, and/or other variables. After, the resulting chlorine-treated substrate is subjected to testing in step 302 to determine the extent of chlorine diffusion in a lateral direction. This testing can be done either before a wet etch step by appropriate analytical techniques or, alternatively, by testing the substrate after wet etching has removed the metal halides, thus showing the extent of lateral etching on the structure to be treated. A determination is made in step 303 as to whether there has been excessive lateral diffusion. If lateral diffusion is excessive, in step 304 process changes are made and a new substrate is exposed to chlorine in step 301. If the extent of lateral diffusion is appropriate, a determination whether additional plasma etching is made in step 305. If the chlorine treatment is complete, the substrate treatment is complete, as represented by block 306. In step 307, the substrate can then be treated with further chlorine and wet etch steps as desired given the structure to be created on the substrate. After a desired extent of etching has been achieved, in step 308 the substrate is removed from the apparatus and process treatment ends.

The general aspects of substrate preparation of a MTJ stack is shown for example in US Patent Application 20140141532, which has a common assignee to this application, the contents of which published application is incorporated by reference in its entirety.

The plasma processing chamber may include a first electrode provided in the processing chamber, a second electrode provided to face the first electrode, a first power supply unit configured to apply a power having a first frequency to the first electrode, and a second power supply unit configured to apply a power having a second frequency to the second electrode. Further, the second power supply unit may apply a power having a frequency of about 1 MHz or less as the second frequency to the second electrode to generate plasma in the processing chamber. In this case, since the power having a relatively low frequency is applied to the second electrode, plasma is generated at a position apart from a substrate to be etched. Thus, an ion can be vertically attracted by the second electrode, and verticality of a side wall of the substrate can be improved accordingly.

The second power supply unit may apply a power having a frequency of about 400 kHz or less as the second frequency to the second electrode to generate plasma in the processing chamber. In this case, since the power having a relatively low frequency of about 400 kHz is applied to the second electrode, plasma is generated at a position apart from the substrate. Thus, verticality of a side wall of the multilayered material to be etched can be improved.

The first power supply unit may apply a power of about 100 W to about 300 W to the first electrode to generate plasma in the processing chamber. In this case, since the relatively low power is applied to the first electrode, low-density plasma is generated at a lower limit of the margin of the plasma ignition, and for example, the etched insulating layer or first magnetic layer can be exhausted to the outside in the form of an organic metal complex having a large molecular structure.

The plasma processing chamber may further include an exhaust unit configured to depressurize the processing space to a predetermined pressure level and a control unit configured to control the exhaust unit. Further, the control unit may control the exhaust unit to allow a pressure in the processing space to be about 10 mTorr to about 30 mTorr. In this case, by setting the pressure in the processing space to be low, a density of plasma generated in the processing space can be reduced, and by lengthening an ion mean free path, verticality of etching profile can be improved.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A process for etching a substrate which includes an insulating layer disposed between first and second magnetic layers, comprising:
    contacting the substrate with a chlorine containing plasma at a temperature no greater than 30 degrees Centigrade under conditions effective to convert at least a portion of the first and second magnetic layers and the insulating layer into metal chlorides; and
    treating the resulting substrate of the contacting step with an organic solvent under conditions effective to remove the metal chlorides from the resulting substrate to provide an etched substrate, wherein
    the chlorine containing plasma is removed from substrate prior to treating the substrate with the organic solvent.

2. The process of claim 1, wherein the chlorine containing plasma is formed from a chlorine containing gas, wherein the chlorine containing gas is chlorine, boron trichloride, or a mixture thereof.

3. The process of claim 2, wherein the chlorine containing gas is diluted with a second inert gas.

4. The process of claim 1, wherein the organic solvent is an alcohol, an ether, or acetone.

5. The process of claim 4, wherein the organic solvent includes a solvent capable of reacting with the metal chlorides.

6. The process of claim 1, wherein the insulating layer is magnesium oxide.

7. The process of claim 1, wherein the first and second magnetic layers both contain cobalt and iron.

8. The process of claim 1, further comprising subjecting the etched substrate to measurements to determine whether the extent of metal removed by the chlorine plasma and organic solvent treatment corresponds to pre-defined operational objectives.

9. The process of claim 8, wherein at least one operational variable of the process is adjusted based on the measurements to meet at least one operational objective.

10. The process of claim 9, wherein the at least one operational variable is temperature, pressure, chlorine concentration, chlorine flow rate, type of organic solvent, flow rate of the organic solvent, time of contact of the chlorine with the substrate, and combinations thereof.

11. The process of claim 8, wherein the operational objective is the vertical conformity of the etched substrate to a desired pattern.

12. The process of claim 8, wherein the operational objective is the extent of lateral etching of the substrate.

13. The process of claim 8, wherein the at least one operational variable is adjusted to either reduce or increase the extent of etching of the substrate.

14. The process of claim 13, further comprising:
contacting the etched substrate with a chlorine containing plasma at a temperature no greater than 30 degrees Centigrade under conditions effective to convert at least a portion of the first and second magnetic layers and the insulating layer into metal chlorides;
treating the resulting substrate of the contacting step of the etched substrate with an organic solvent under conditions effective to remove the metal chlorides to provide a second etched substrate.

15. The process of claim 13, further comprising:
contacting a second substrate with a chlorine containing plasma at a temperature no greater than 30 degrees Centigrade under conditions effective to convert at least a portion of the first and second magnetic layers and the insulating layer into metal chlorides;
treating the resulting second substrate of the contacting step with an organic solvent under conditions effective to remove the metal chlorides from the resulting structure to provide an etched second substrate.

16. The process of claim 13, wherein the at least one operational variable is adjusted after the etched substrate has been formed or wherein the at least one operational variable is adjusted while the substrate is being treated.

17. The process of claim 13, the measurement includes generating a vertical profile of the etched substrate, comparing the vertical profile to a target vertical profile, and adjusting operating variables to process the substrate to form an MRAM structure having a tolerance between vertical profile and target vertical profile.

18. The process of claim 17, wherein substrate is processed down to a density of 20 nm or less of space and line or space and pillar.

19. The process of claim 1, wherein the substrate is a semiconductor wafer being processed to form a magnetoresistive random access memory device which includes at least one magnetic tunnel junction stack structure.

* * * * *